United States Patent [19]
Sasagawa et al.

[11] Patent Number: 5,200,879
[45] Date of Patent: Apr. 6, 1993

[54] DRIVE CIRCUIT FOR VOLTAGE DRIVEN TYPE SEMICONDUCTOR DEVICE

[75] Inventors: Kiyoaki Sasagawa; Hiroshi Miki, both of Kawasaki, Japan

[73] Assignee: Fuji Electric Co., Ltd., Kawasaki, Japan

[21] Appl. No.: 729,480

[22] Filed: Jul. 12, 1991

[30] Foreign Application Priority Data

Jul. 19, 1990 [JP] Japan .................................. 2-191058

[51] Int. Cl.⁵ ............................................. H03K 17/56
[52] U.S. Cl. ......................................... 361/93; 361/18
[58] Field of Search ....................... 361/18, 86, 88, 89, 361/91, 101, 93, 100

[56] References Cited

U.S. PATENT DOCUMENTS 4,721,869 1/1988 Okado ................... 361/88
4,949,213 8/1990 Sasagawa et al. .................... 361/91

Primary Examiner—A. D. Pellinen
Assistant Examiner—S. Jackson
Attorney, Agent, or Firm—Spencer, Frank & Schneider

[57] ABSTRACT

A drive circuit for a voltage driven type semiconductor device having a serial circuit of a resistor and a Zener diode. One terminal of the serial circuit is connected to an output terminal (collector) of the semiconductor device. An overcurrent flowing in the semiconductor device is detected based on a current flowing through the serial circuit and the presence or absence of a drive signal fed to the drive circuit from an external control circuit. The detection level of the overcurrent can be adjusted by the voltage of the Zener diode, and the quick detection becomes possible. This arrangement makes it possible to detect an overcurrent in the semiconductor device, and hence to detect a shortcircuit in a circuit connected to that device in a minimal time required, thereby reducing the energy consumed in the semiconductor device during the short circuit.

21 Claims, 12 Drawing Sheets

DRIVE CIRCUIT FOR VOLTAGE DRIVEN TYPE SEMICONDUCTOR DEVICE

BACKGROUND OF THE INVENTION

1. Field of the Invention

The present invention relates to a drive circuit for a voltage driven type semiconductor device such as an IGBT (Insulated Gate Bipolar Transistors) or MOSFET, and in particular to a drive circuit having an overcurrent protection function that can protect the semiconductor device from an overcurrent fault caused by a short circuit or the like in a power conversion apparatus such as an inverter.

2. Discription of the Prior Art

FIGS. 1A and 1B are views illustrating the basic operation of a conventional overcurrent protection circuit of this type: FIG. 1A is a block diagram showing a gate drive system of a power conversion apparatus; and FIG. 1B is a diagram showing an equivalent circuit illustrating a voltage and current applied to a semiconductor device during a short circuit fault. Incidentally, the following description uses an IGBT as an example of a voltage driven type semiconductor device, and the same reference characters designate the same or corresponding parts throughout the drawings.

In FIGS. 1A and 1B, to the gate of an IGBT Q1 is applied a gate voltage $V_{GE}$ from a gate drive circuit 1 which turns on and off the IGBT Q1 in response to a drive signal $V_{DR}$ fed from a PWM control circuit 2.

Generally, the IGBT Q1 is a member constituting a three-phase bridge as shown in FIG. 4A. When a short circuit fault occurs at the load side of the bridge, for example, a voltage and current will be applied to the IGBT Q1 as shown in FIG. 1B: a short circuit current Ic flows from collector to emitter in the IGBT Q1 with a direct voltage Ed being applied thereto via a wire inductance L. The short circuit current Ic reaches four to five times the rated DC current of the IGBT Q1, or even about ten times the rated current in a high withstanding voltage device. Consequently, the instantaneous power applied to the IGBT Q1 during the short circuit period is extremely large, and hence, the IGBT must be turned off through the gate in a short time (less than about 10 μsec) to cut off the overcurrent after the short circuit takes place. For this reason, an overcurrent protective function is incorporated in the gate drive circuit.

FIG. 2 is a circuit diagram showing an example of a conventional gate drive circuit with an overcurrent protection function. In this figure, reference character Q1 designates an IGBT as a main switching device, PH1 denotes a photocoupler for isolating the drive signal $V_{DR}$ applied from the control circuit (not shown in this figure), V1 denotes a voltage source for supplying an on-gate voltage, and V2 designates a voltage source for supplying an off-gate voltage.

The normal operation of the gate drive circuit of FIG. 2 will be described referring to FIG. 3A. When the photocoupler PH1 is turned on by the drive signal $V_{DR}$ (time t0 of FIG. 3A), a transistor T1 turns off, thereby turning a transistor T2 on and a transistor T3 off. Thus, the on-gate voltage V1 is applied across the gate and emitter of the IGBT Q1 through a gate resistor $R_G$. At the same time, a transistor T11 turns off, by which a base current tries to flow in the transistor T4 through a resistor R11 and a Zener diode ZD1. The on-timing of the transistor T4, however, is delayed by a capacitor C1 connected to the collector of the transistor T11.

The on-voltage applied across the gate-emitter of the IGBT Q1 turns on the IGBT Q1, and so the collector-to-emitter voltage $V_{CE}$ of the IGBT Q1 drops to the on-voltage $V_{CE}$(on). At the same time, the voltage at the positive terminal of the capacitor C1 (i.e., the voltage at the cathode of the Zener diode ZD1) is dropped to the on state voltage of the IGBT Q1 via a diode D1. In the ON condition of the IGBT Q1, the transistor T4 is maintained at the OFF state by selecting components to satisfy the following inequality.

$$V_{ZD1} + V_{BE(T4)} > V2 + V_{CE(on)} + V_{F(D1)} \qquad (1)$$

where
$V_{ZD1}$ is the Zener voltage of the Zener diode ZD1;
$V_{BE}$(T4) is the $V_{BE}$ of the transistor T4; and
$V_F$(D1) is the forward voltage of the diode D1.

Subsequently, when the photocoupler PH1 is turned off by the elimination of the drive signal $V_{DR}$, the transistor T1 turns on, which turns the transistor T2 off and the transistor T3 on. Thus the IGBT Q1 is turned off because of the off-gate voltage V2 applied across the gate and emitter of the IGBT Q1 through the gate resistor $R_G$. At the same time, the transistor T11 is turned on, which discharges the capacitor C1 to prepare for the next turn-on operation of the IGBT Q1.

When a short circuit fault takes place during the ON period of the IGBT Q1 (time t1 of FIG. 3A), the following inequality is satisfied as the collector-to-emitter voltage of the IGBT Q1 increases.

$$V_{ZD1} + V_{BE(T4)} < V2 + V_{CE(on)} + V_{F(D1)} \qquad (2)$$

Thus, the transistor T4 conducts at time t2 (a delay time Td after the time t1, and hence the transistor T2 is turned off and the transistor T3 is turned on. This will apply the off-gate voltage V2 across the gate and emitter of the IGBT Q1, thereby turning off the IGBT Q1 to cut off the overcurrent. The delay time Td is provided to delay the on-timing of the transistor T4 until the IGBT Q1 has completed turning on, thereby preventing the overcurrent protective transistor T4 from being turned on during normal operation. Accordingly, the delay time Td will be called the "turn-on confirming time" hereinafter. In the course of this, the gate-to-emitter voltage $V_{GE}$ of the IGBT Q1 declines with time in accordance with the voltage on the capacitor C2, which is different from the normal turn-off operation as indicated by the solid line after time t2 in FIG. 3C. As a result, the reduction rate of the collector current Ic becomes small, thereby preventing a spike voltage $V_{CEP}$ in the voltage $V_{CE}$ during the current interruption. Incidentally, broken lines in FIG. 3C represent waveforms when an overcurrent is cut off by directly adding the off-gate voltage V2 to the gate of IGBT Q1.

The overcurrent protection in the gate drive circuit of FIG. 2, however, presents the following problems:

(1) The capacitor C1 (as a turn-on confirming timer) provides the turn-on confirming time Td to delay the on-timing of the transistor T4. As a result, the gate voltage $V_{GE}$ of the IGBT Q1 does not begin to decline until time t2 at which the transistor T4 conducts even if an overcurrent began to flow earlier at time t1 as shown in FIG. 3A. After time t2, the gate voltage declines, and interrupts the IGBT Q1 when it falls below the threshold voltage $V_{GE}$(th) of the IGBT. In this case, the turn-on confirming time Td must be set relatively long in the conventional circuit. This will be described in more detail below.

FIG. 4A is a circuit diagram of a main circuit of the inverter; and FIG. 4B is a diagram illustrating waveforms of the turn-on operation of the IGBT. In FIG. 4A, reference character C0 denotes a smoothing capacitor constituting the direct current voltage source Ed, Q1 (Q11–Q16) designate IGBTs constituting a three-phase bridge inverter, and D0 (D01–D06) designate freewheeling diodes connected to the IGBTs Q11–Q16 in parallel fashion, respectively.

When the IGBT Q1 turns on, the collector-to-emitter voltage $V_{CE}$ of the IGBT suddenly decreases after the reverse recovery (after time t11 of FIG. 4A) of the freewheeling diode which is connected to the IGBT in an arm of the bridge inverter, and finally reaches a saturation voltage. The rate of decline of the voltage $V_{CE}$ in this case becomes smaller as the voltage decreases, and hence the turn-on time defined as a time from t11 to t12 is relatively large. Consequently, the turn-on confirming time Td must be set relatively long. As a result, in the conventional gate drive circuit, an unduly large collector current Ic flows in the IGBT during the overcurrent protection operation, and hence energy comsumption in the IGBT is large, thereby applying a great stress to the IGBT.

(2) There is another problem in the overcurrent protection operation during a short circuit fault in the IGBT inverter arranged as shown in FIG. 4A. FIGS. 3A and 3B illustrate this problem: FIG. 3A illustrates waveforms of the IGBT operation when the drive signal $V_{DR}$ fed from the PWM control circuit 2 to the gate drive circuit 1 has a broad pulsewidth; and FIG. 3B illustrates waveforms of the IGBT operation when the drive signal $V_{DR}$ has a narrow pulsewidth.

The problem is that a so-called soft interruption does not work in some occasions depending on the pulsewidth of the drive signal $V_{DR}$ and the timing of the short circuit fault. The term soft interruption means turning off the IGBT slowly so as to prevent a counter-electromotive force caused by the wire inductance L. The soft interruption is accomplished by slowly decreasing the gate voltage $V_{GE}$.

The soft interruption works normally when the pulsewidth of the drive signal $V_{DR}$ is broad enough to continue beyond a term $T_W$ that begins at time t1 when a short circuit fault occurs and terminates at time t3 when the overcurrent is interrupted, thereby turning off the IGBT Q1 safely as shown in FIG. 3A.

In contrast to this, when the drive signal $V_{DR}$ terminates during the term $T_W$ as shown in FIG. 3B, the gate voltage $V_{GE}$ suddenly changes as in a normal turn-off operation, and the soft interruption does not function. As a result, a spike voltage $V_{CEP}$ takes place as shown in FIG. 3B. Thus, the soft interruption does not work (a) when the pulse width of the drive signal $V_{DR}$ is narrow or (b) when the drive signal $V_{DR}$ terminates just after a short circuit fault occurs. This hinders the IGBT Q1 from turning off safely.

SUMMARY OF THE INVENTION

It is therefore an object of the present invention to provide a drive circuit for a voltage drive type semiconductor device that can reduce energy consumption during a short circuit, and can positively protect the semiconductor device from an overcurrent.

According to an aspect of the present invention, there is provided a drive circuit for a voltage driven type semiconductor device comprising:

a photocoupler which is turned on and off by a drive signal fed from an external control circuit;

a pair of output transistors whose bases are connected each other, and are operatively connected to an output of the photocoupler;

a voltage driven type semiconductor device which has a control terminal, a first main terminal, and a second main terminal, the control terminal and the first main terminal being supplied with control signals from outputs of the output transistors, and the first main terminal and the second terminal being made conductive or nonconductive by the control signals;

a serial circuit of a resistor and a Zener diode, a first terminal of the serial circuit being connected to the second main terminal of the semiconductor device so that the serial circuit conducts when a voltage across the first and second main terminals of the semiconductor device exceeds a predetermined voltage;

means for detecting, after a predetermined time has elapsed since the output of the photocoupler is produced to turn on the semiconductor device, the presence of the output of the photocoupler and a current flowing through the serial circuit; and a variable voltage source, whose terminal is connected to the bases of the output transistors via a diode, for gradually reducing the voltage of the variable voltage source itself during detection by the means for detecting, and for inducing the semiconductor device to an off state with the decline of the voltage.

Here, the drive circuit for a voltage driven type semiconductor device may further comprise a diode connected between the control terminal of the semiconductor device and the variable voltage source so as to shunt a displacement current produced by an overcurrent applied to the semiconductor device.

The drive circuit for a voltage driven type semiconductor device may further comprise a transistor which is induced to turn on by the voltage decline of the variable voltage source so as to provide a current path between the control terminal and the first main terminal of the semiconductor device to shunt a displacement current produced by an overcurrent applied to the semiconductor device.

The drive circuit for a voltage driven type semiconductor device may further comprise means for latching the output of the photocoupler so as to hold the semiconductor device in an on state after detection by the means for detecting.

The drive circuit for a voltage driven type semiconductor device may further comprise means for latching the output of the photocoupler so as hold the semiconductor device in an on state based on detection by the means for detecting for a predetermined period after the drive signal changes.

The present invention includes the serial circuit of the resistor and Zener diode whose terminal is connected to the output terminal of the voltage driven type semiconductor device (the collector in the case of an IGBT), and detects an overcurrent by determining whether an excessive forward voltage drop exists on the basis of the presence and absence of a current flowing in the serial circuit, and simultaneously by detecting the presence of the drive signal $V_{DR}$ after the turn-on confirming time. In addition, once the overcurrent is detected, the overcurrent protection operation ignores the elimination of the drive signal $V_{DR}$.

According to the present invention, the voltage of the Zener diode can be selected independently of a voltage supplied to the gate drive circuit. This makes it possible to set the detection level for the overcurrent at a high level, which can shorten the time required to detect the overcurrent, and hence the turn-on confirming time, thereby reducing energy consumed by the semiconductor device during the short circuit fault.

Furthermore, since the overcurrent operation ignores the change in (elimination of) the drive signal $V_{DR}$ during the overcurrent, the overcurrent flowing in the semiconductor device can be softly interrupted independently of the pulsewidth of the drive signal $V_{DR}$ and the timing of a short circuit fault. This makes it possible to positively protect the semiconductor device from the overcurrent.

The above and other objects, effects, features and advantages of the present invention will become more apparent from the following description of the embodiments thereof taken in conjunction with the accompanying drawings.

DETAILED DESCRIPTION OF PREFERRED EMBODIMENTS

The invention will now be described with reference to the accompanying drawings.

FIRST EMBODIMENT

Figure 5:
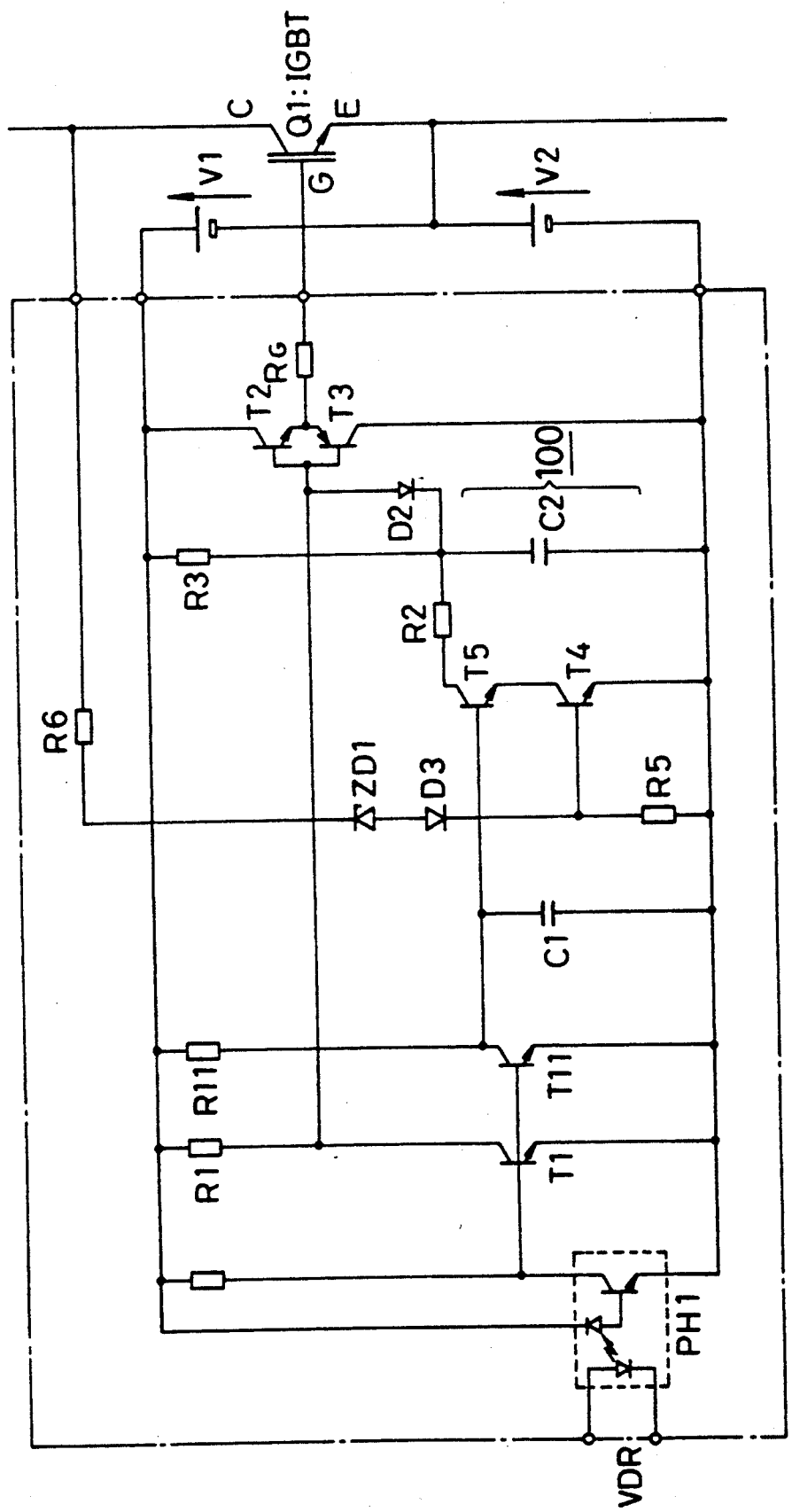
FIG. 5 is a circuit diagram showing an arrangement of a drive circuit for a semiconductor device having a variable voltage source.

FIG. 5 is a circuit diagram showing a drive circuit for a semiconductor device as a first embodiment of the present invention. The normal switching operation is similar to that of the conventional drive circuit of FIG. 2; the switching operation is carried out by a transistor T1 receiving the output signal of a photocoupler PH1, and transistors T2 and T3 connected to the transistor T1.

Figure 1A:
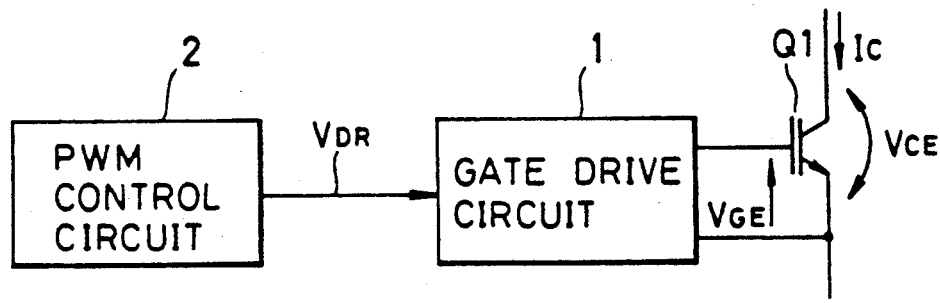
FIGS. 1A and 1B are views illustrating the basic operation of a conventional overcurrent protection circuit, FIG. 1A being a block diagram showing a gate drive system of a power conversion apparatus, and FIG. 1B being a diagram showing an equivalent circuit of FIG. 1A illustrating a voltage and current applied to a semiconductor device during a short circuit fault.
Figure 1B:
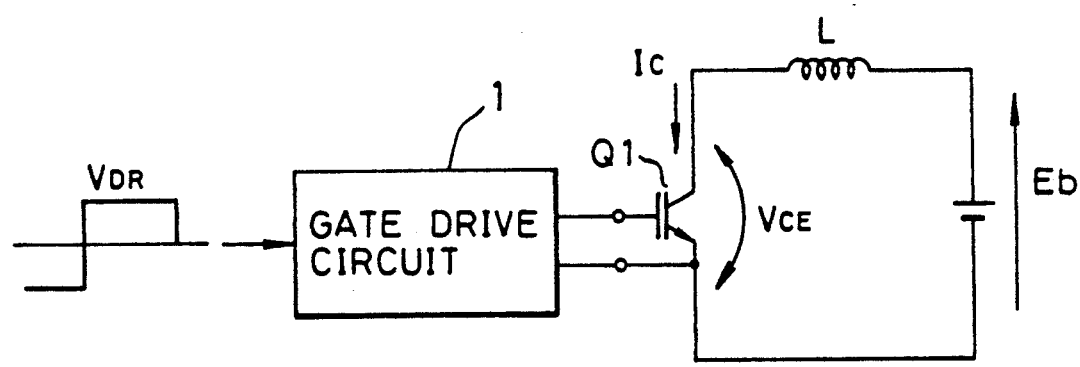
Figure 2:
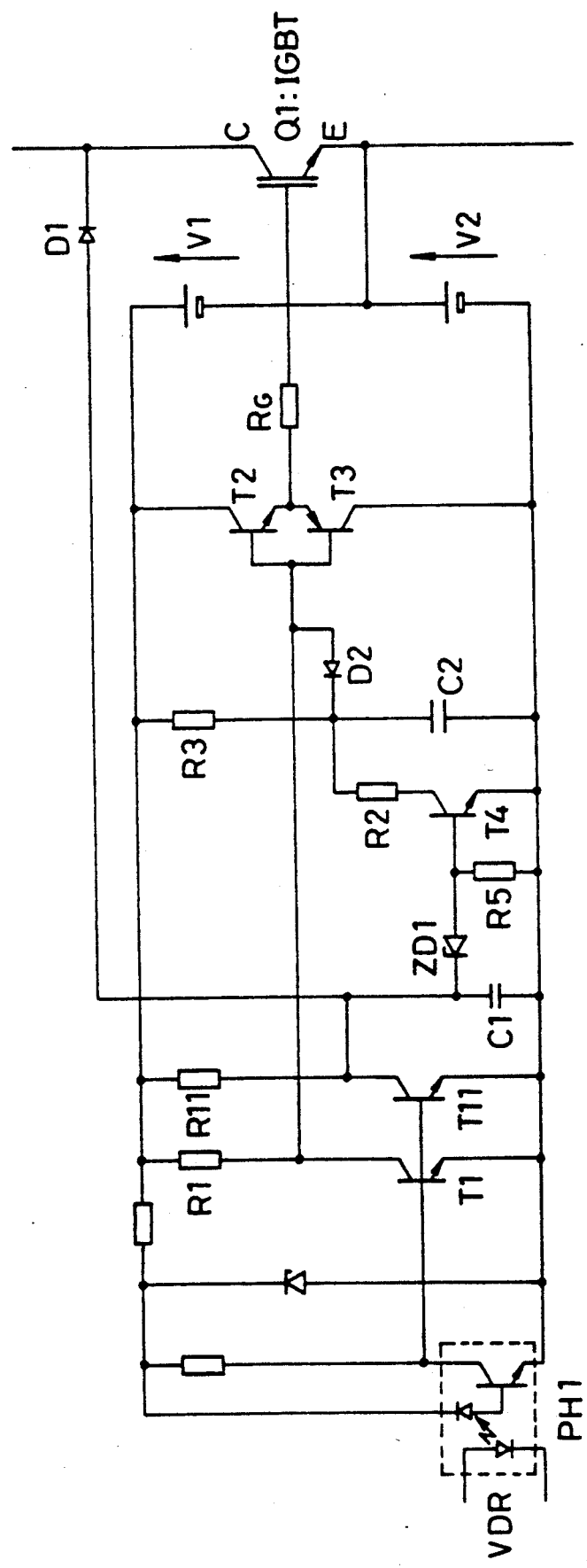
FIG. 2 is a circuit diagram showing an example of a conventional gate drive circuit with an overcurrent protection function.
Figures 3A, 3B:
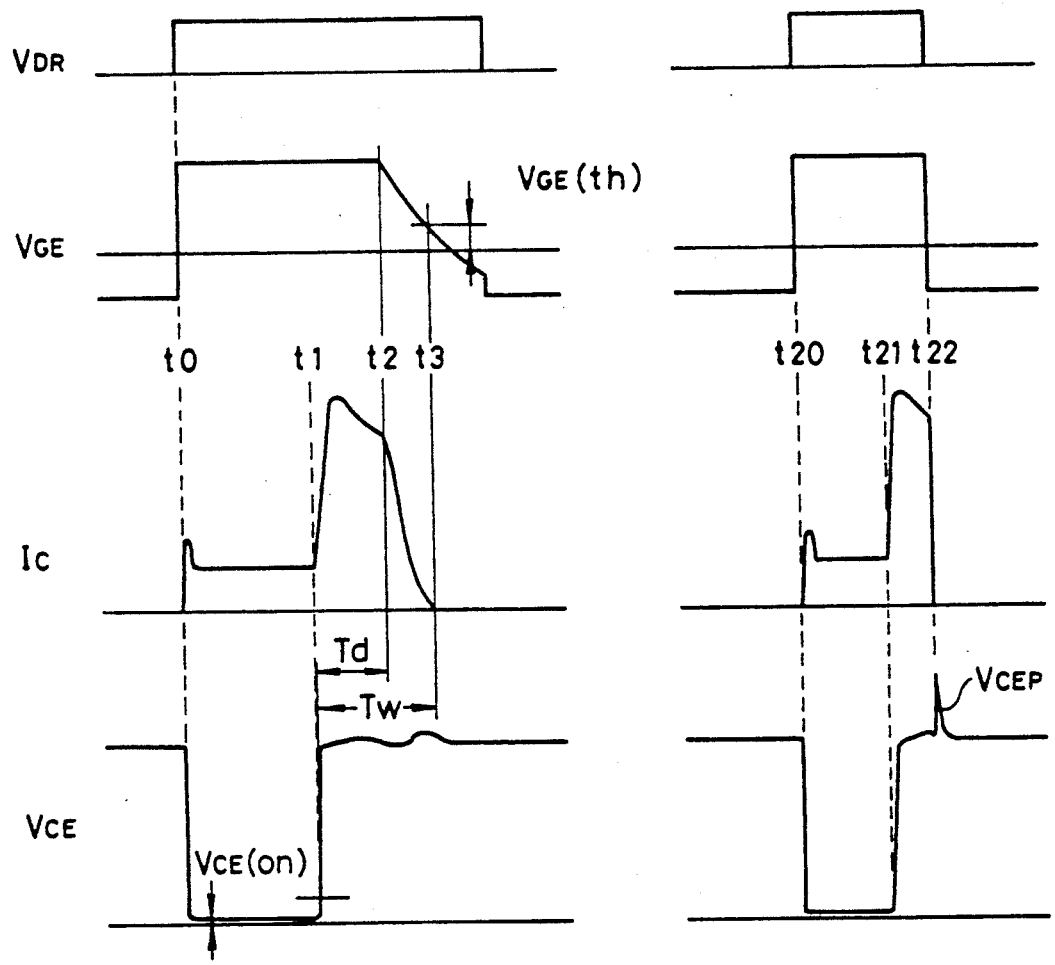
FIG. 3A is a diagram illustrating waveforms of the IGBT operation when the drive signal $V_{DR}$ fed from the PWM control circuit 2 to the gate drive circuit 1 has a broad pulsewidth.
FIG. 3B is a diagram illustrating waveforms of the IGBT operation when the drive signal $V_{DR}$ has a narrow pulsewidth.
Figure 3C:
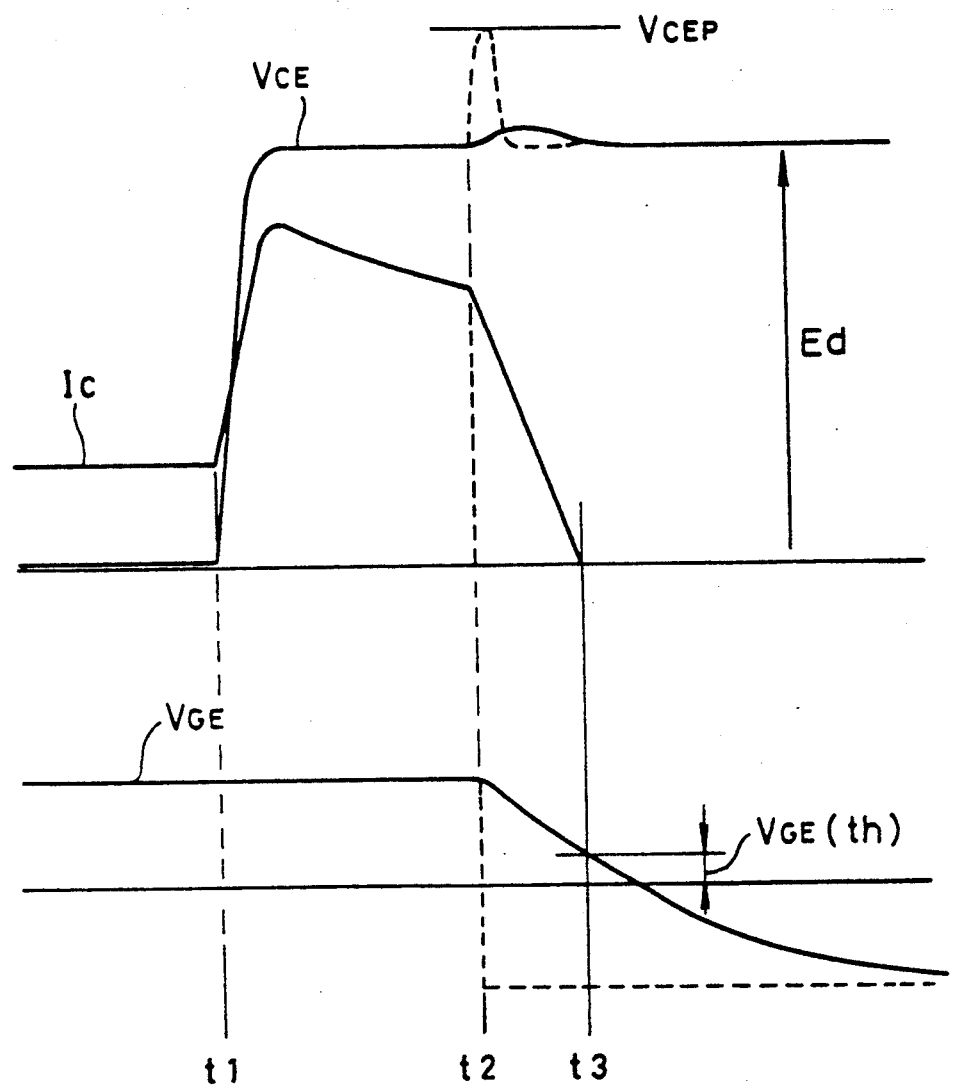
FIG. 3C is a diagram illustrating waveforms for explaining the conventional overcurrent protection operation.

The drive circuit of this embodiment differs from that of FIG. 2 in that it has a variable voltage source 100 including serially connected resistor R2 and capacitor C2, and transistors T4 and T5. The transistor T5 detects the presence and absence of the drive signal $V_{DR}$ fed from the control circuit 2 of FIG. 1A, and provides a turn-on confirming time Td determined by a capacitor C1 and a resistor R11 to ensure the turn-on of the IGBT Q1 when the drive signal $V_{DR}$ rises at time t30 in FIG. 6 The transistor T4, on the other hand, detects the terminal voltage or the collector-to-emitter voltage $V_{CE}$ of the IGBT Q1 by using a serial circuit of resistors R5 and R6, a diode D3, and a Zener diode ZD1, which serial circuit is connected to the output (collector) terminal of the IGBT Q1. The transistor T4 turns on when it detects a current flowing in the resistor R5. Accordingly, if the voltage $V_{CE}$ increases owing to an short circuit fault, the transistor T4 detects it and turns on. Thus, the serial circuit of the transistors T4 and T5 discharges the capacitor C2 only when the terminal voltage $V_{CE}$ is increased by a short circuit fault or the like during the time IGBT Q1 is in the ON state.

This arrangement makes it possible to elevate the detection level of the terminal voltage $V_{CE}$ higher than that of the convention circuit, and hence to shorten the turn-on confirming time Td. This will be described with reference to FIG. 4B.

Figure 4A:
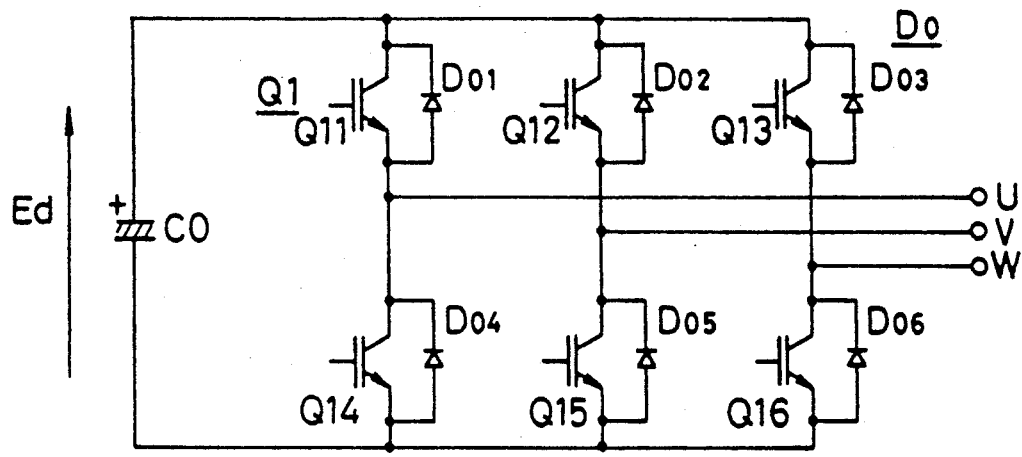
FIGS. 4A and 4B are views illustrating the turn-on operation of IGBTs in an inverter, FIG. 4A being a circuit diagram of a main circuit of the inverter, and FIG. 4B being a diagram illustrating waveforms of the turn-on operation of the IGBT.
Figure 4B:
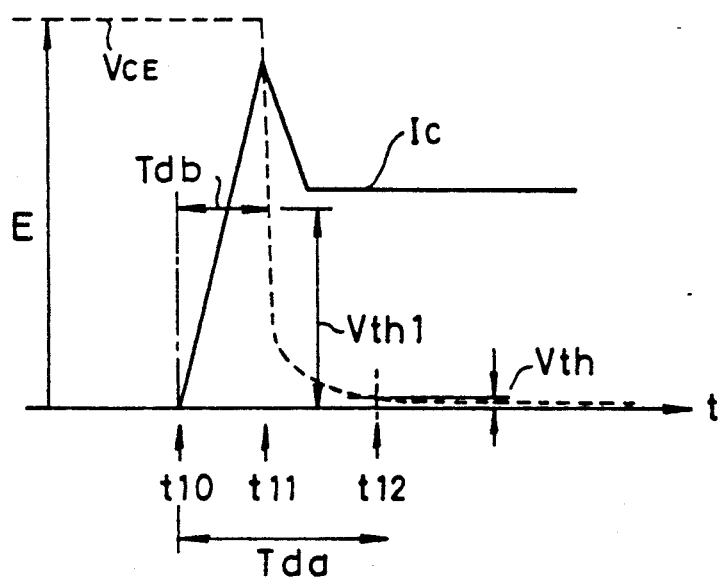

In FIG. 4B, the conventional turn-on confirming time Td a must be greater than time t12 because the terminal voltage $V_{CE}$ becomes less than the conventional detection level Vth only after the time t12. In contrast to this, the detection level of the present embodiment can be arbitrarily selected independently of the supply voltage to the gate drive circuit. When the detection level is specified at $V_{th1}$ of FIG. 4B, a turn-on confirming time Tdb slightly larger than time t11 can be set.

Figure 6:
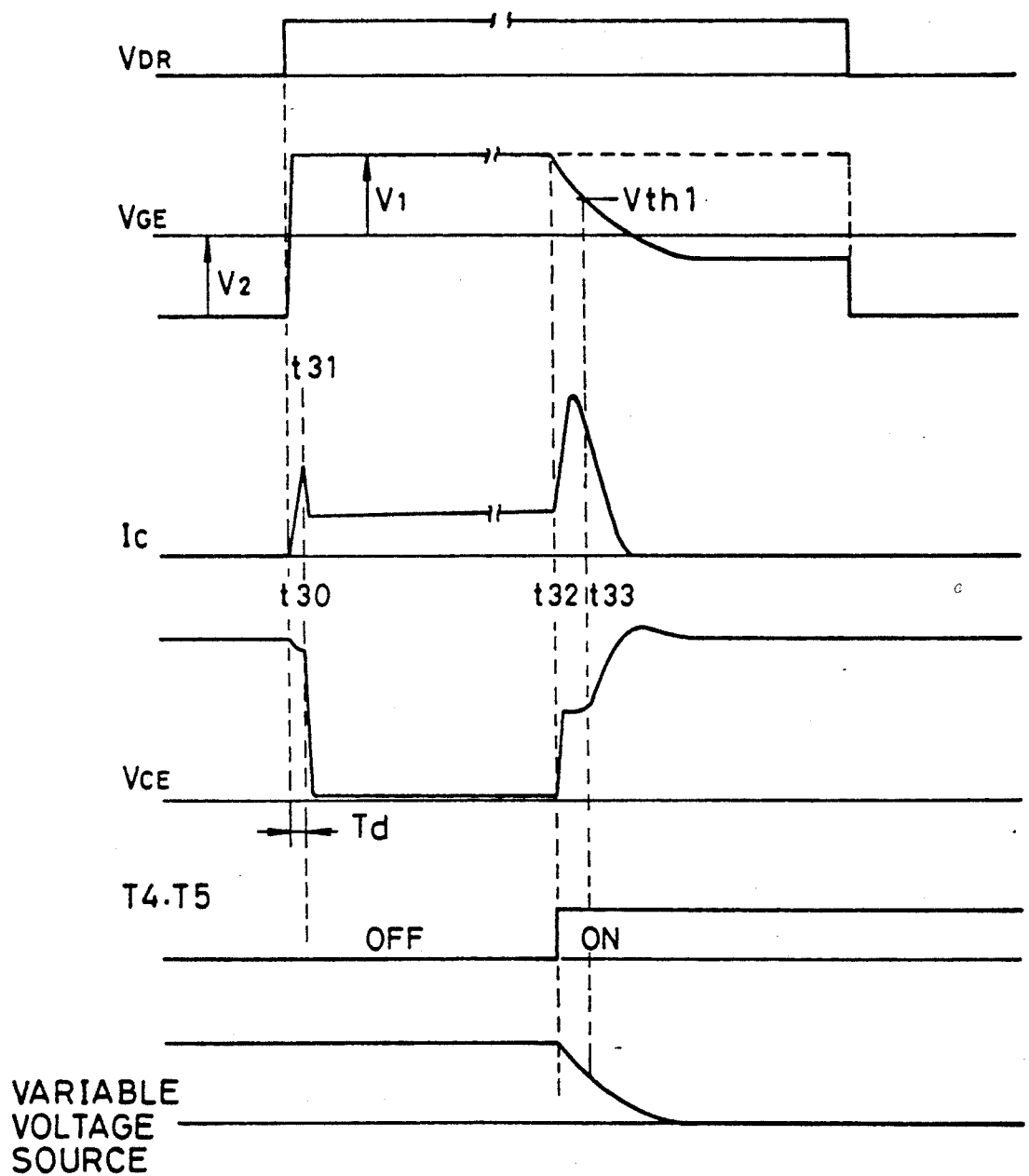
FIG. 6 is a diagram illustrating waveforms for explaining an operation of the drive circuit of FIG. 5.

In a turn-on process of the IGBT Q1, the freewheeling diode connected with the IGBT Q1 in an arm of the three-phase inverter bridge is maintained in a short circuit state until time t11 or t31 in FIG. 6 when the reverse recovery of the freewheeling diode has been completed. Even if a short circuit fault takes place, the behavior of the collector current Ic is the same as that of this normal turn-on state until the time t11 or t31. Accordingly, an overcurrent during a short circuit fault can be detected slightly after the time t11, and the overcurrent protection operation is started by this detection. Thus, the overcurrent of the IGBT Q1 can be interrupted even during the turn-on time from t11 to t12, and hence the IGBT Q1 is positively protected.

The overcurrent protection operation of the drive circuit of FIG. 5 is as follows: When the photocoupler PH1 is in the ON state, transistors T1 and T11 are in the OFF state, the transistor T2 is in the ON state and the transistor T3 is in the OFF state. Thus, an on-gate voltage V1 is applied across the gate and emitter of the IGBT Q1 through a gate resistor $R_G$. Here, since the transistor T11 is in the OFF state, the base current of the transistor T5 that detects the presence of the drive signal $V_{DR}$ and provides the turn-on confirming time Td tries to flow from the resistor R11. The base current, however, cannot flow in the transistor T5 because the transistor T4 which detects the collector-to-emitter voltage $V_{CE}$ and is serially connected to the transistor T5 is maintained in the OFF state because the voltage $V_{CE}$ of the IGBT Q1 is low, and hence no current flows through the resistor R5. Thus, the capacitor C2 serving as a variable voltage source 100 is not discharged (time t31–t32 in FIG. 6).

When an overcurrent takes place in this state at time t32, the collector-to-emitter voltage $V_{CE}$ of the IGBT Q1 increases. Consequently, a current flows through the resistor R6, the Zener diode ZD1, the diode D3, the resistor R5 and the off-gate voltage source V2, so that the transistor T4 conducts. When this occurs, the transistor T5 also conducts, thereby starting the discharge of the capacitor C2. As a result, the gate-to-emitter voltage $V_{GE}$ of the IGBT Q1 declines with elapsing time as shown in FIG. 6, and thus the overcurrent can be safely interrupted at time t33 when the voltage $V_{GE}$ declines to the detection level $V_{th1}$.

In this embodiment, since the turn-on confirming time Td can be shortened as described above, the energy consumption by the IGBT Q1 can be reduced, thereby increasing the reliability of the protection of the IGBT.

SECOND EMBODIMENT

Figure 7:
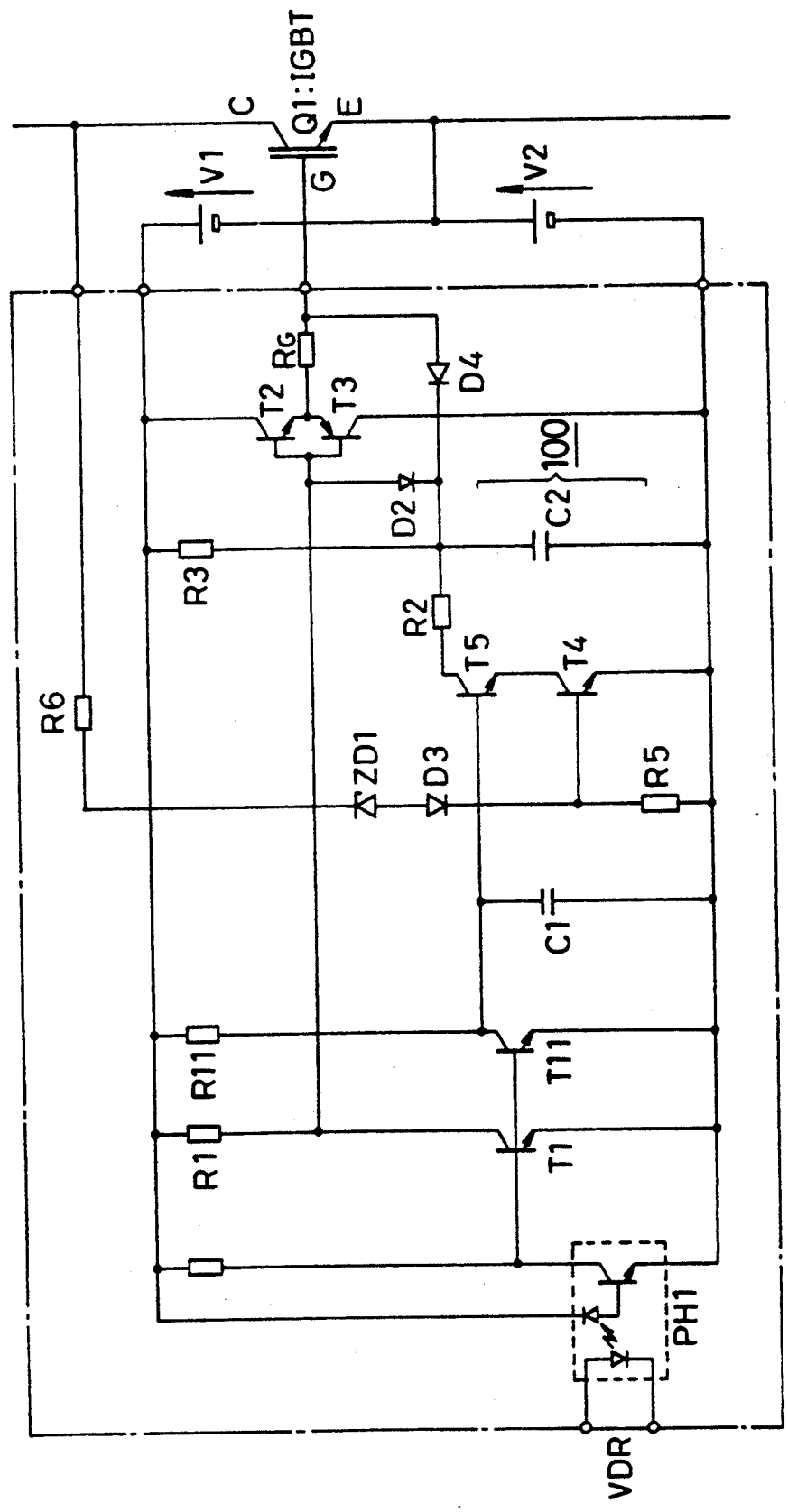
FIG. 7 is a circuit diagram showing an arrangement that shortens IGBT turn-off time.

FIG. 7 is a circuit diagram showing an arrangement of a gate drive circuit as a second embodiment of the present invention. The capacitor C2 constituting the variable voltage source 100 is connected to the gate G of the IGBT Q1 via a diode D4 for shunting a displacement current that pours into IGBT Q1 via junction capacity (not shown in FIG. 7) of the IGBT Q1 when an increasing collector-to-emitter voltage $V_{CE}$ is applied to the IGBT Q1. The diode D4 shunts the displacement current so as to prevent the gate voltage $V_{GE}$ of the Q1 from rising, which serves to shorten the turn-off time of the IGBT Q1.

THIRD EMBODIMENT

Figure 8:
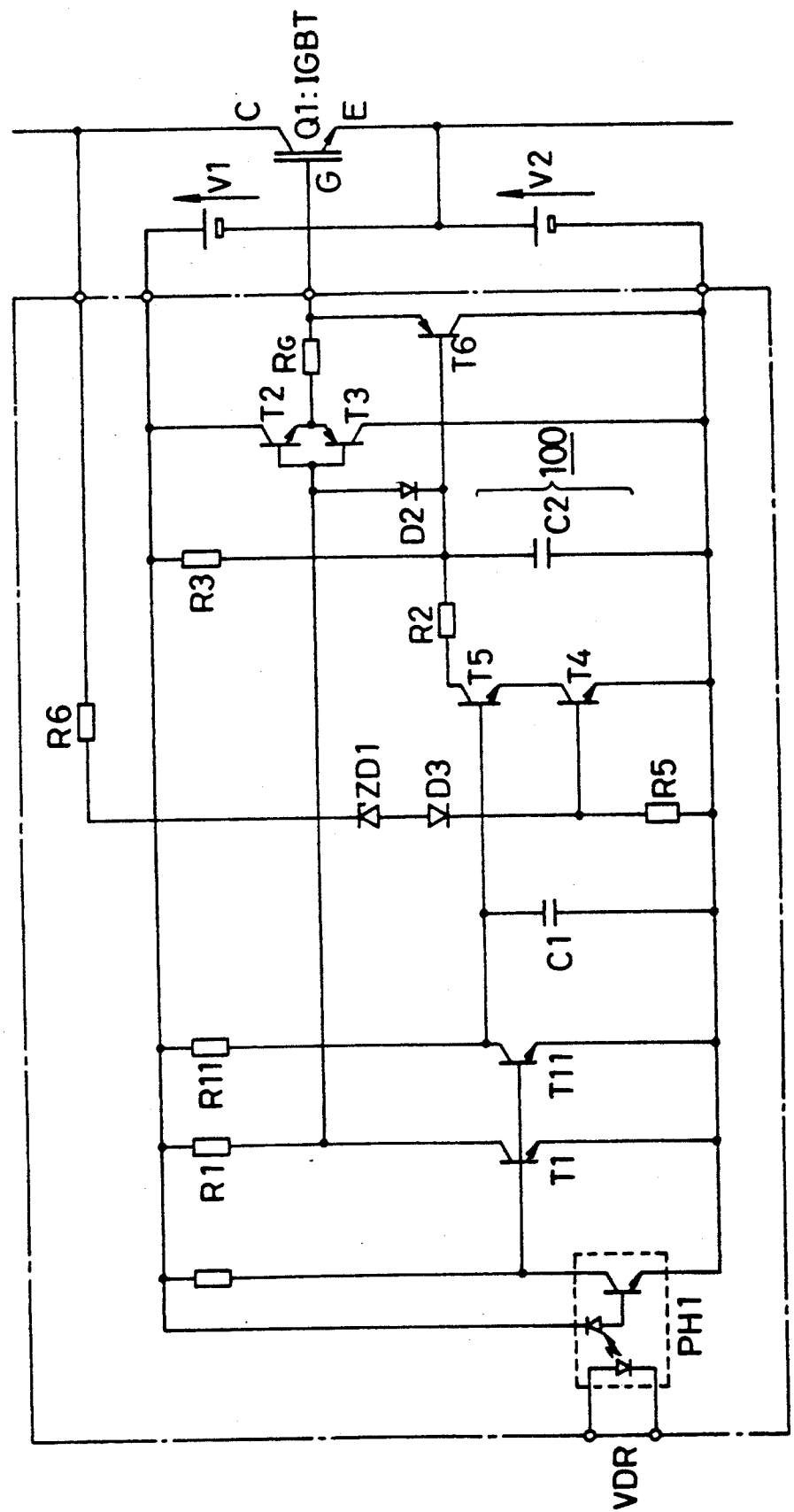
FIG. 8 is a circuit diagram showing an arrangement of a gate drive circuit having a transistor that turns on to shunt displacement current.

FIG. 8 is a circuit diagram showing an arrangement of a gate drive circuit as a third embodiment of the present invention. This embodiment is provided, with a PNP transistor T6 in addition to the components shown in FIG. 5. The transistor T6 turns on as the voltage of the capacitor C2 making up the variable voltage source 100 declines, thereby shunting the displacement current. During the overcurrent protection operation, the transistor T6 shortcircuits the gate and emitter of the IGBT Q1 so as to prevent the gate voltage $V_{GE}$ of IGBT Q1 from increasing due to the displacement current.

FOURTH EMBODIMENT

Figure 9:
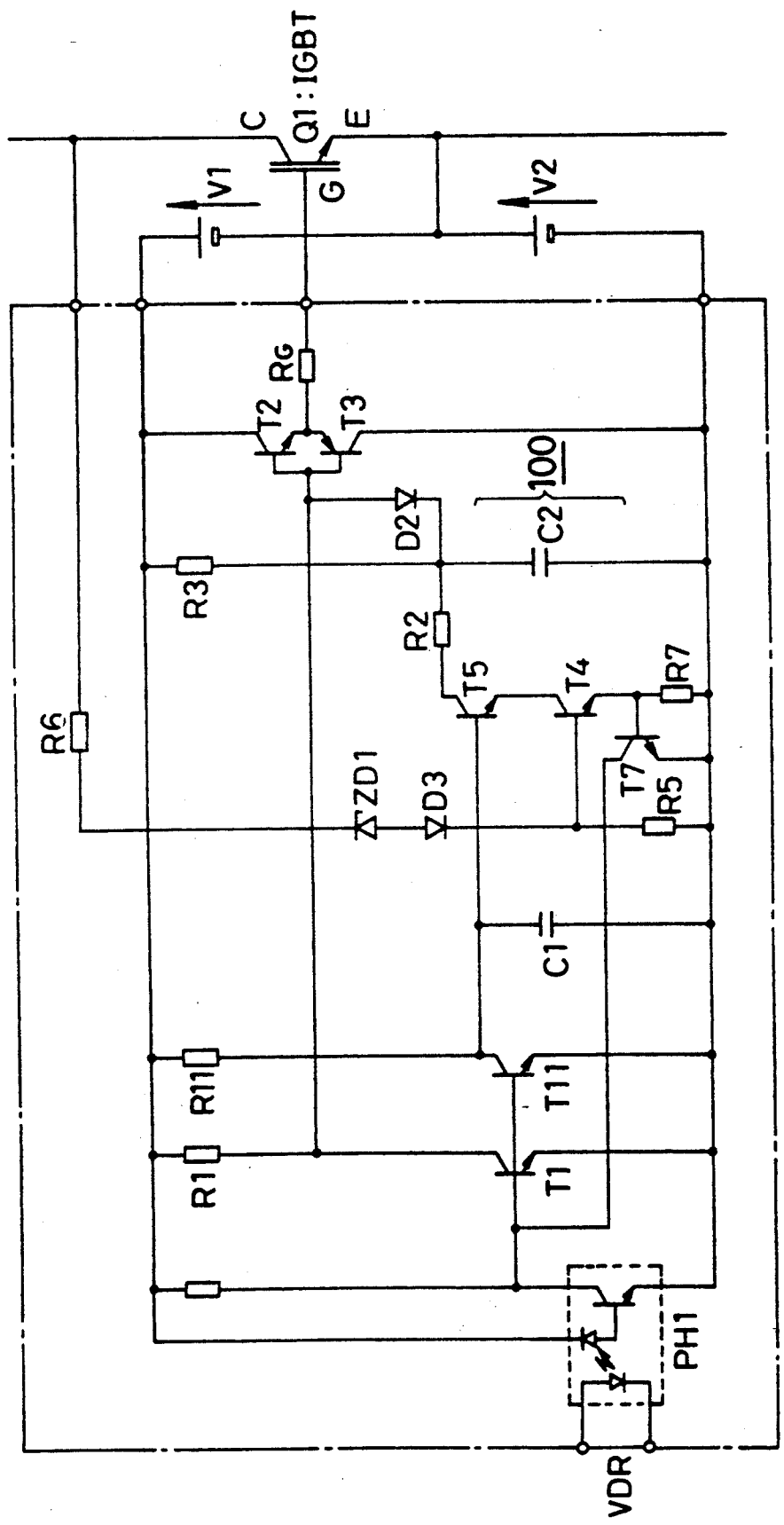
FIG. 9 is a circuit diagram showing an arrangement of a gate drive circuit that maintains protection operation even when the drive signal is removed.

FIG. 9 is a circuit diagram showing an arrangement of a gate drive circuit as a fourth embodiment of the present invention. This embodiment is provided, in addition to the components shown in FIG. 5, with a resistor R7 inserted in the discharge path of the capacitor C2, and a transistor T7 whose base is connected to the resistor R7. The transistor T7 turns on during the overcurrent protection operation because of the discharge current of the capacitor C2 flowing through the resistor R7. Thus, the output of the photocoupler PH1 is shortcircuited so that the protection operation is maintained even when the drive signal $V_{DR}$ is eliminated.

FIFTH EMBODIMENT

Figure 10:
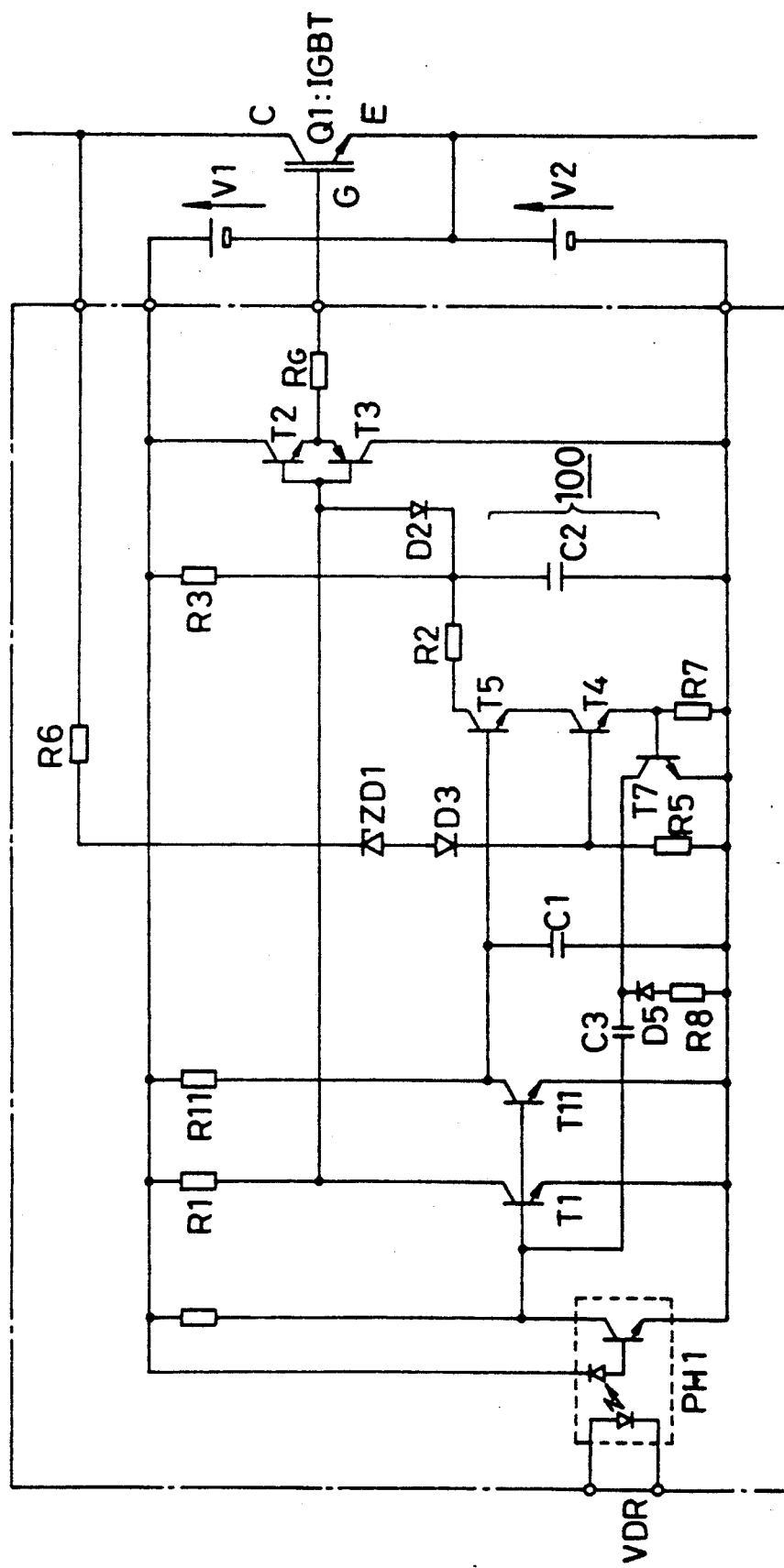
FIG. 10 is a circuit diagram showing an arrangement of a gate drive circuit that obviates the reset operation of the power supply.

FIG. 10 is a circuit diagram showing an arrangement of a gate drive circuit as a fifth embodiment of the present invention. This embodiment is provided, in addition to the components shown in FIG. 9, with a capacitor C3 inserted in the collector circuit of a transistor T7. When the drive signal $V_{DR}$ is present, the capacitor C3 is discharged through a discharge circuit composed of the photocoupler PH1, a resistor R8 and a diode D5. On the other hand, when the drive signal $V_{DR}$ is absent, the capacitor C3 is charged by a current flowing through a resistor (not numbered) connected to the collector of the photodetector PH1 and the transistor T7. Accordingly, if the drive signal $V_{DR}$ changes from present to absent during the time transistor T7 is on, the capacitor C3 is gradually charged so that transistors T1 and T11 are turned on, and as a result the IGBT Q1 turns off at a predetermined time after the change of the drive signal. This makes it possible to obviate the reset operation of the power supply which is necessary each time the protection circuit operates in the above embodiments 1–4.

SIXTH EMBODIMENT

Figure 11:
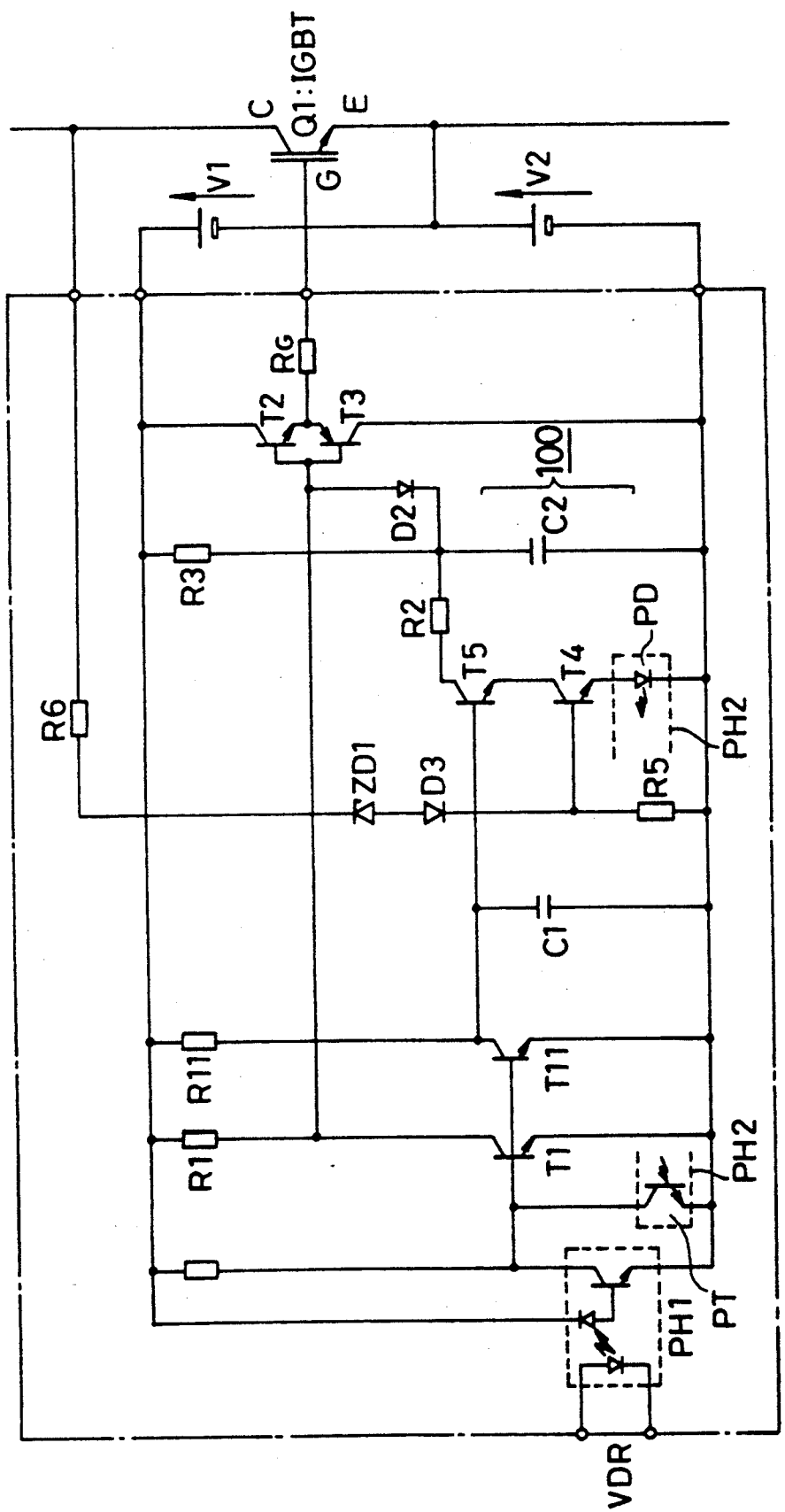
FIG. 11 is a circuit diagram showing an arrangement of a gate drive circuit that allows the protection operation to function independently of the change of the drive signal.

FIG. 11 is a circuit diagram showing an arrangement of a gate drive circuit as a sixth embodiment of the present invention. This embodiment is provided with a photocoupler PH2, instead of the resistor R7 and the transistor T7 of FIG. 9, with a photocoupler PH2. A light emitting diode PD of the photocoupler PH2 is inserted in the discharging circuit of a capacitor C2, and an output transistor PT of the photocoupler PH2 shortcircuits the output of the photocoupler PH1. The operation of the embodiment is similar to that of the embodiment 4, and the protection operation functions independently of the change of the drive signal $V_{DR}$.

Although specific embodiments of a drive circuit for a voltage driven type semiconductor device constructed in accordance with the present invention have been disclosed, it is not intended that the invention be restricted to either the specific configurations or the uses disclosed herein. Modifications may be made in a manner obvious to those skilled in the art. Accordingly, it is intended that the invention be limited only by the scope of the appended claims.

What is claimed is:

1. A drive circuit for a voltage driven type semiconductor device which has a control terminal, a first main terminal, and a second main terminal, comprising:

a photocoupler which is turned on and off by a drive signal fed from an external control circuit;

a pair of output transistors whose bases are connected to each other, and are operatively connected to an output of said photocoupler, said control terminal and said first main terminal of said semiconductor device being supplied with control signals from outputs of said output transistors, and said first main terminal and said second main terminal of said semiconductor device being made conductive or nonconductive by said control signals;

a serial circuit which includes a resistor and a Zener diode, a first terminal of said serial circuit being connected to said second main terminal of said semiconductor device so that said serial circuit conducts when a voltage across said first and second main terminals of said semiconductor device exceeds a predetermined voltage;

first detecting means for detecting, after a predetermined time has elapsed since an output of said photocoupler is produced to turn on said semiconductor device, the presence of the output of said photocoupler;

second detecting means, serially connected with said first detecting means, for detecting a current flowing through said serial circuit so as to detect an overcurrent through said semiconductor device;

a diode; and a variable voltage source, having a terminal which is connected to the bases of said output transistors via said diode, for gradually reducing a voltage of said variable voltage source itself while said first and second detecting means simultaneously detect the presence of the output of said photocoupler and the overcurrent through said semiconductor device, and for inducing said semiconductor device to an off state with the decline of said voltage, wherein a detecting level of said second detecting means can be set independently of the predetermined time associated with said first detecting means.

2. A drive circuit for a voltage driven type semiconductor device as claimed in claim 1, further comprising a diode connected between said control terminal of said semiconductor device and said variable voltage source so as to shunt a displacement current produced by an overcurrent through said semiconductor device.

3. A drive circuit for a voltage driven type semiconductor device as claimed in claim 1, further comprising a transistor which is induced to turn on by the voltage decline of said variable voltage source so as to provide a current path between said control terminal and said first main terminal of said semiconductor device to shunt a displacement current produced by an overcurrent through to said semiconductor device.

4. A drive circuit for a voltage driven type semiconductor device as claimed in claim 1, further comprising means for shortcircuiting said output of said photocoupler so as to hold said semiconductor device in an on state after detection by said first and second detecting means.

5. A drive circuit for a voltage driven type semiconductor device as claimed in claim 1, further comprising means for shortcircuiting said output of said photocoupler so as to hold said semiconductor device in an on state based on detection by said first and second detecting means for a predetermined period after said signal changes.

6. A drive circuit for a voltage driven type semiconductor as claimed in claim 1, wherein said first detecting means comprises a resistor connected to an output of said photocoupler, a capacitor connected to another output of said photocoupler, said capacitor additionally being connected to said resistor at an intermediate connection point, and a first detection transistor having a base that is connected to the intermediate connection point, and wherein said second detecting means comprises a second detection transistor connected in series with said first detection transmitter.

7. A drive circuit for controlling a semiconductor device in response to a PWM drive signal from a control circuit, the semiconductor device having a gate terminal and first and second main terminals, comprising:

a first output transistor having a base terminal and first and second main terminals;

a second output transistor having a base terminal and first and second main terminals, the base terminal of the second output transistor being connected to the base terminal of the first output transistor and the second main terminal of the second output transistor being connected to the second main terminal of the first output transistor;

means for electrically connecting the second main terminals of the first and second output transistors to the gate terminal of the semiconductor device;

an on-gate voltage source connected between the first main terminal of the semiconductor device and the first main terminal of the first output transistor;

an off-gate voltage source connected between the first main terminal of the semiconductor device and the first main terminal of the second output transistor;

input means, connected to the base terminals of the output transistors, for receiving the drive signal and for generating an input signal for the output transistors in response to the drive signal, the input signal having a first digital state or a second digital state;

a resistor and a capacitor connected in series between the first main terminal of the first output transistor and the first main terminal of the second output transistor, the resistor and capacitor being connected to one another at an intermediate connection point;

means for electrically connecting the intermediate connection point to the bases of the output transistors;

first detecting means for detecting the first digital state of the input signal a predetermined time after a transition from the second digital state to the first digital state, the first detecting means including a third transistor having a main current path;

second detecting means for detecting an overcurrent through the semiconductor device, the second detecting means including a fourth transistor having a main current path; and means for connecting the main current path of the third transistor and the main current path of the fourth transistor in a series circuit across the intermediate connection point and the first main terminal of the second output transistor.

8. The drive circuit of claim 7, wherein the means for connecting the main current path of the third transistor and the main current path of the fourth transistor in a series circuit comprises a resistor in series with the main current paths of the third and fourth transistors.

9. The drive circuit of claim 7, wherein the means for electrically connecting the second main terminals of the first and second output transistors to the gate terminal of the semiconductor device comprises a resistor.

10. The drive circuit of claim 8, wherein the means for electrically connecting the intermediate connection point to the bases of the output transistors comprises a diode.

11. The drive circuit of claim 7, wherein the fourth transistor additionally has a base terminal, and wherein the second detecting means additionally includes a series circuit connecting the second main terminal of the semiconductor device to the first main terminal of the second output transistor, the base terminal of the fourth transistor being connected to the series circuit.

12. The drive circuit of claim 11, wherein the fourth transistor detects current through the series circuit.

13. The drive circuit of claim 11, wherein the series circuit comprises a resistor and a Zener diode.

14. The drive circuit of claim 7, wherein the input means comprises a photocoupler which receives the drive signal, and means for inverting an output signal from the photocoupler to generate the input signal for the output transistors.

15. The drive circuit of claim 7, further comprising a diode connecting the gate terminal of the semiconductor device to the intermediate connection point.

16. The drive circuit of claim 7, further comprising another transistor having a base terminal which is connected to the intermediate connection point and having a main current path which is connected between the gate terminal of the semiconductor device and the first main terminal of the second output transistor.

17. The drive circuit of claim 7, further comprising an additional transistor having a base terminal which is connected to the series circuit across the intermediate connection point and the first main terminal of the second output transistor and having a first main terminal which is connected to the first main terminal of the second output transistor.

18. The drive circuit of claim 17, wherein the additional transistor additionally has a second main terminal that is connected to the input means.

19. The drive circuit of claim 17, wherein the additional transistor additionally has a second main terminal, and further comprising a capacitor connecting the second main terminal of the additional transistor to the input means, and a diode and a resistor connected in series between the second main terminal of the additional transistor and the first main terminal of the second output transistor.

20. The drive circuit of claim 7, wherein the means for connecting the main current path of the third transistor and the main current path of the fourth transistor in a series circuit comprises a photodiode in series with the main current paths of the third and fourth transistors, and further comprising a first phototransistor connected to the input means, the first phototransistor being optically exposed to the photodiode.

21. The drive circuit of claim 20, wherein the input means comprises a photocoupler having a second phototransistor that is connected to the first phototransistor.

* * * * *